United States Patent [19]
Yamaguchi

[11] Patent Number: 5,134,319
[45] Date of Patent: Jul. 28, 1992

[54] BICMOS DIFFERENTIAL AMPLIFIER HAVING IMPROVED SWITCHING SPEED

[75] Inventor: Shuhei Yamaguchi, Nagoya, Japan

[73] Assignees: Fujitsu Limited, Kanagawa; Fujitsu VLSI Limited, Kasugai, both of Japan

[21] Appl. No.: 638,917

[22] Filed: Jan. 9, 1991

[30] Foreign Application Priority Data

Jan. 10, 1990 [JP] Japan .................................. 2-2728
Jan. 10, 1990 [JP] Japan .................................. 2-2729

[51] Int. Cl.⁵ .......................... H03K 19/02; H03F 3/45
[52] U.S. Cl. .................................. 307/570; 307/446; 307/530; 307/355; 307/356
[58] Field of Search ........ 307/443, 446, 530, 355–356, 307/570

[56] References Cited

U.S. PATENT DOCUMENTS

4,876,467 10/1989 Koshizuka ......................... 307/446
4,937,480  6/1990 Higuchi et al. ..................... 307/570

FOREIGN PATENT DOCUMENTS

0032227  2/1984 Japan ................................. 307/570

OTHER PUBLICATIONS

IBM Tech. Disc. Bul. vol. 14 No. 1 Jun. 1971 "FET-emitter follwer cell" D. W. Kemerer.

Primary Examiner—Stanley D. Miller
Assistant Examiner—M. Wambach
Attorney, Agent, or Firm—Nikaido, Marmelstein, Murray & Oram

[57] ABSTRACT

A level changing semiconductor integrated circuit includes two current paths in which emitters of first and second bipolar transistors are each connected in series to one terminal of first and second MOSFETs, respectively. The current paths are disposed between a high-potential power source and a low-potential power source. Gates of the first and second MOSFETs are cross-connected to the emitters of the bipolar transistors of opposite current paths. The emitters of the first and second bipolar transistors provide output signals. At least two different types of input signals having different signal levels are simultaneously applied to respective input units of the current paths.

4 Claims, 8 Drawing Sheets

BICMOS DIFFERENTIAL AMPLIFIER HAVING IMPROVED SWITCHING SPEED

BACKGROUND OF THE INVENTION

1. Field of the Invention

The present invention relates to a semiconductor integrated circuit device, and particularly to a semiconductor integrated circuit device used as a differential amplifier circuit for amplifying an output of a sense amplifier, etc.

2. Description of the Related Art

It is usually difficult to form capacitors in an integrated circuit (IC) due to limited space. To deal with this, a direct-coupled circuit is frequently used, however, this circuit has a problem of drift. To solve this problem, a differential amplifier circuit having a pair of transistors is used. The differential amplifier circuit is required to operate at high speed, consume less electric power, and have a large power source and a large temperature margin.

FIG. 1 shows a conventional semiconductor integrated circuit device serving as a differential amplifier circuit. This circuit is interposed between, for example, a sense amplifier of a semiconductor memory and an output buffer circuit, to amplify an output level of the sense amplifier and provide it to the output buffer circuit.

In FIG. 1, numerals 1 and 2 denote NMOS transistors for receiving input signals, and 3 and 4 denote PMOS transistors that are cross-connected with the NMOS transistors 1 and 2. Nodes 21 and 22 provide output signals. Gates of the NMOS transistors 1 and 2 receive binary digital input signals IN1 and IN2, respectively. These input signals are inverted relative to each other. Sources of the NMOS transistors 1 and 2 are connected to a ground, i.e., a low-potential power source Vss.

The input signals IN1 and IN2 form binary levels between, for example, 4 V and 3.1 V. When the signal IN1 is High (H), the NMOS transistor 1 is turned ON to set the node 21 to Low (L), e.g., 0 V. This level L is applied to the gate of the PMOS transistor 4 to turn ON the PMOS transistor 4, thereby setting the node 22 to H, e.g., Vcc=5 V. In this way, the levels of the input signals IN1 and IN2 are amplified between 0 V and Vcc, and supplied from the nodes 21 and 22 to the outside. When the input signal IN1 is L, an operation opposite to the above will take place.

The conventional semiconductor integrated circuit device mentioned above may realize a certain amount of high-speed operation and low power consumption but must be further improved to achieve a speedier operation.

Using MOS transistors may be advantageous in reducing power consumption but restrict operation speeds. There is room, therefore, to utilize high-speed characteristics of other active elements such as bipolar transistors.

SUMMARY OF THE INVENTION

An object of the present invention is to provide a level changing semiconductor integrated circuit device serving as a differential amplifier circuit that can operate at high speed and low power consumption.

In order to accomplish the object, the present invention provides a level changing semiconductor integrated circuit comprising a first current path and a second current path. The first current path involves a first bipolar transistor and a first MOSFET (Metallic Oxide Semiconductor Field Effect Transistor) that are connected in series. The emitter of the first bipolar transistor is connected to one terminal of the first MOSFET, and the collector of the first bipolar transistor is connected to a high-potential power source. The other terminal of the first MOSFET is connected to a low-potential power source.

The second current path involves a second bipolar transistor and a second MOSFET that are connected in series. The emitter of the second bipolar transistor is connected to one terminal of the second MOSFET, and the collector of the second bipolar transistor is connected to the high-potential power source. The other terminal of the second MOSFET is connected to the low-potential power source.

The gate of the first MOSFET is cross-connected to the emitter of the second bipolar transistor of the second current path, and the gate of the second MOSFET is cross-connected to the emitter of the first bipolar transistor of the first current path. The emitters of the first and second bipolar transistors provide output signals.

At least two kinds of input signals having different signal levels are simultaneously applied to respective first and second input devices of the first and second current paths, thereby controlling currents flowing through the first and second current paths.

In this way, the level changing semiconductor integrated circuit device of the present invention uses a special combination of bipolar transistors and MOSFETs, and controls each output with at least two kinds of input signals having different levels, thereby amplifying the input signals. The present invention properly uses characteristics of the bipolar transistors to improve the switching speed of a high-load operation as well as reducing power consumption.

DESCRIPTION OF THE PREFERRED EMBODIMENTS

Level changing semiconductor integrated circuits according to embodiments of the present invention will be explained in detail with reference to the drawings.

Figure 3:
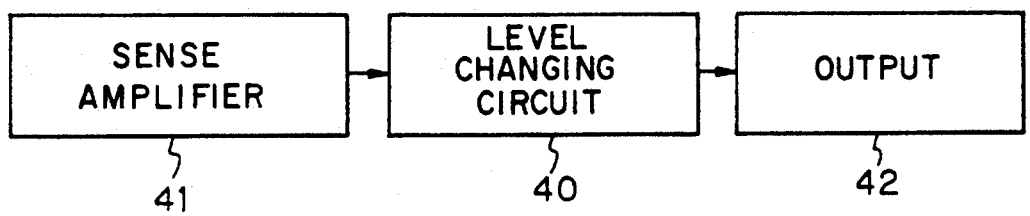
FIG. 3 is a block diagram showing a level changing semiconductor integrated circuit used for a sense amplifier, according to the present invention.

In FIG. 3, a level changing semiconductor integrated circuit 40 according to the present invention is disposed between an output of a sense amplifier circuit 41 and a proper output circuit 42 to amplify an output of the sense amplifier circuit 41 and supply the amplified signal to the output circuit 42. Basically, the level changing circuit 40 has a differential amplifying function. The sense amplifier circuit 41 reads data from a memory cell and amplifies the read data. The level changing circuit 40 further amplifies the data signal and provides it to the output circuit 42. The output circuit 42 buffers and amplifies an output signal of the level changing circuit 40 and provides it to the outside.

Figure 2:
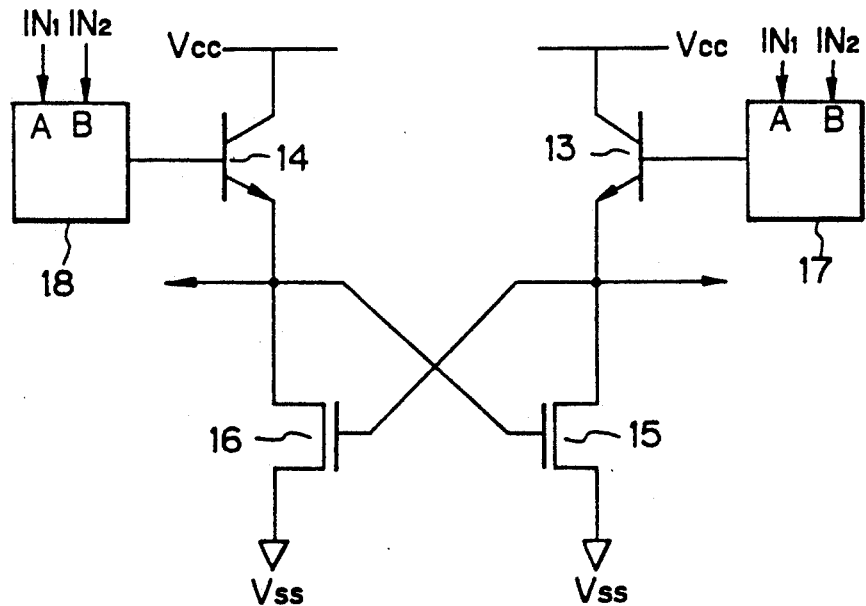
FIG. 2 is a circuit diagram showing an essential arrangement of a level changing semiconductor integrated circuit according to the present invention.

FIG. 2 shows a basic arrangement of the level changing semiconductor integrated circuit 40 providing the differential amplifying function.

In FIG. 2, the circuit 40 comprises a first current path I1 and a second current path I2. The first current path I1 involves a first bipolar transistor 13 and a first MOSFET 15 that are connected in series. The emitter of the first bipolar transistor 13 is connected to one terminal of the first MOSFET 15, and the collector of the first bipolar transistor 13 is connected to a high-potential power source Vcc. The other terminal of the first MOSFET 15 is connected to a low-potential power source Vss.

The second current path I2 involves a second bipolar transistor 14 and a second MOSFET 16 that are connected in series. The emitter of the second bipolar transistor 14 is connected to one terminal of the second MOSFET 16, and the collector of the second bipolar transistor 14 is connected to the high-potential power source Vcc. The other terminal of the second MOSFET transistor 16 is connected to the low-potential power source Vss.

The gate of the first MOSFET 15 is cross-connected to the emitter of the second bipolar transistor 14 of the second current path I2, and the gate of the second MOSFET 16 is cross-connected to the emitter of the first bipolar transistor 13 of the first current path I1. The emitters of the first and second bipolar transistors 13 and 14 provide output signals.

Two kinds of input signals IN1 and IN2 having different signal levels are simultaneously applied to respective first and second input means 17 and 18 of the first and second current paths I1 and I2, thereby controlling currents flowing through the first and second current paths I1 and I2.

In this way, the semiconductor integrated circuit of the present invention comprises two current paths I1 and I2 each having a differential amplifying function. Each of the current paths comprises the bipolar transistor and MOSFET that are connected to each other in series. The gate of the MOSFET 15 (16) of the current path I1 (I2) is cross-connected to the emitter of the bipolar transistor 14 (13) of the other current path I2 (I1).

The input means 17 and 18 for driving the current paths I1 and I2 simultaneously receive at least two kinds of input signals IN1 and IN2 having different signal levels, thereby controlling currents flowing through the current paths.

The input means 17 (18) has at least two input terminals for receiving the two kinds of input signals, and at least one output terminal connected to the base of the bipolar transistor 13 (14) of the current path I1 (I2).

The two kinds of input signals IN1 and IN2 may be any signals having different signal levels. For example, they may be digital signals of values 0 and 1, or complementary signals such as a signal Vout and an inverted signal of the signal Vout.

In the embodiments of the present invention, the two kinds of input signals are analog signals having different signal levels provided by a sense amplifier. For example, one input signal IN1 may be a high-level signal of 2.5 V, and the other input signal IN2 may be a low-level signal of 1.5 V.

The input means 17 (18) of the present invention simultaneously uses the two kinds of input signals IN1 and IN2 in controlling the current path I1 (I2), thereby amplifying the input signals IN1 and IN2. The input means are so constituted as to shut off the current path to be cut as soon as possible by a switching action.

According to the present invention, the input means 17 and 18 for controlling the respective current paths I1 and I2 are identical to each other. Each of the input means 17 and 18 has two input terminals A and B, and the input means 17 and 18 oppositely receive input signals.

Namely, in the input means 17 for controlling the first current path I1, the input terminal A receives the first input signal IN1 (having a high signal level, for example), and the input terminal B receives the second input signal IN2 (having a low signal level, for example). On the other hand, in the input means 18 for controlling the second current path I2, the input terminal A receives the second input signal IN2, and the input terminal B receives the first input signal IN1.

With this arrangement, levels of signals applied to the bases of the bipolar transistors 13 and 14 may differ from each other.

Since the level changing semiconductor integrated circuit of the present invention uses bipolar transistors, it presents a very high speed switching capacity particularly in driving a high load such as 1 pf.

Figure 4:
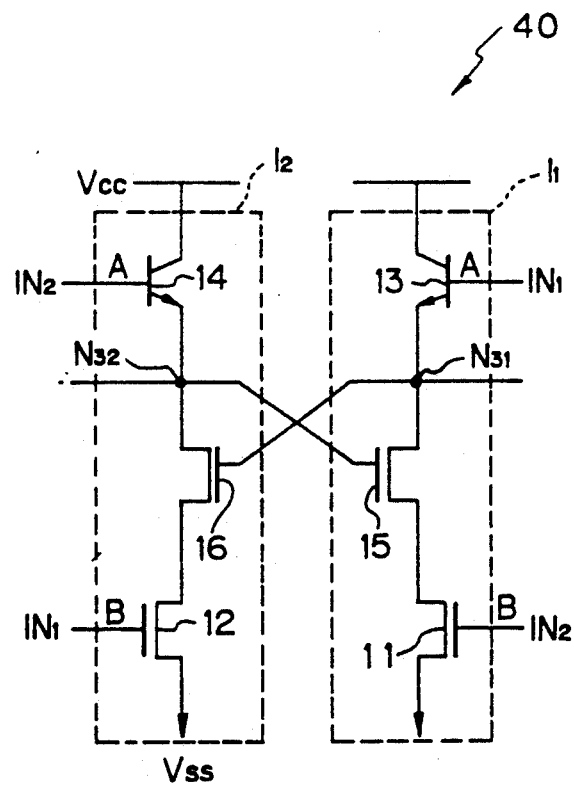
FIG. 4 is a circuit diagram showing a level changing semiconductor integrated circuit according to an embodiment of the present invention.

FIG. 4 shows a semiconductor integrated circuit according to an embodiment of the present invention for realizing the basic arrangement of FIGS. 2 and 3.

In FIG. 4, a third MOSFET 11 is disposed between a first MOSFET 15 and a low-potential power source Vss, and a fourth MOSFET 12 is disposed between a second MOSFET 16 and the low-potential power source Vss. The base of a first bipolar transistor 13 receives a first input signal IN1, and the gate of the third MOSFET 11 receives a second input signal IN2. At the same time, the base of a second bipolar transistor 14 receives the second input signal IN2, and the gate of the fourth MOSFET 12 receives the first input signal IN1.

Namely, an input means 17 for a first current path I1 of this embodiment comprises an input terminal A which is the base of the first bipolar transistor 13, and another input terminal B which is the gate of the third MOSFET 11. Similarly, an input means 18 for a second current path I2 comprises an input terminal A which is the base of the second bipolar transistor 14, and an input terminal B which is the gate of the fourth MOSFET 12.

In this embodiment, the input signals have different signal levels, and are provided to the gates of the third and fourth NMOS transistors 11 and 12 and to the bases of the first and second bipolar transistors 13 and 14. Here, the levels of the input signals applied to the third and fourth NMOS transistors 11 and 12 are opposite to those applied to the first and second bipolar transistors 13 and 14.

The first and second bipolar transistors 13 and 14 operate immediately in response to the input signals, thereby changing the gate potentials of the first and second NMOS transistors 15 and 16 and turning ON/-OFF these transistors 15 and 16. The third and fourth NMOS transistors 11 and 12 operate after the bipolar transistors 13 and 14 in response to the input signals. When the first and second NMOS transistors 15 and 16 are turned ON/OFF, the levels of the output signals change to High (H) or Low (L). The timing of one of the third and fourth NMOS transistors 11 and 12 to turn OFF is earlier than timing of the first and second NMOS transistors 15 and 16 to turn OFF. This can reduce power consumption.

This embodiment can, therefore, properly use the high-speed characteristics of the bipolar transistors, and materialize a high-speed and low-power-consumption differential amplifier circuit.

Next, operation of the embodiment of FIG. 4 will be explained.

The third and fourth NMOS transistors 11 and 12 receive the input signals IN2 and IN1, respectively, and act as active elements such as switching elements. The first and second bipolar transistors 13 and 14 receive the input signals IN1 and IN2, respectively, and act as active elements. The sources of the third and fourth NMOS transistors 11 and 12 are grounded, i.e., connected to the low-potential power source Vss, and the gates thereof receive the input signals IN2 and IN1, respectively.

Between the high-potential power source Vcc and the drain of the third NMOS transistor 11, the first bipolar transistor 13 and the first NMOS transistor 15 are disposed in this order. Between the high-potential power source Vcc and the drain of the fourth NMOS transistor 12, the second bipolar transistor 14 and the second NMOS transistor 16 are disposed in this order. The gate of the first NMOS transistor 15 is cross-connected to the emitter of the second bipolar transistor 14, and the gate of the second NMOS transistor 16 is cross-connected to the emitter of the first bipolar transistor 13.

The bases of the first and second bipolar transistors 13 and 14 receive the input signals IN1 and IN2, respectively. At the same time, the gates of the third and fourth NMOS transistors 11 and 12 receive the input signals IN2 and IN1, respectively. Namely, the first and second current paths I1 and I2 receive the input signals oppositely. The collectors of the first and second bipolar transistors 13 and 14 are connected to the high-potential power source Vcc, and the emitters thereof provide digital output signals.

In this way, a combination of the input signals IN1 and IN2 is supplied to the gates of the third and fourth NMOS transistors 11 and 12, and an inverted combination of the input signals IN1 and IN2 is supplied to the bases of the first and second bipolar transistors 13 and 14.

When the input signal IN1 becomes High (H) and the input signal IN2 Low (L), the first and second bipolar transistors 13 and 14 start to operate at once in response to the input signals, where the first bipolar transistor 13 is turned ON at once to set a node 31 to H. This level H is applied to the gate of the second NMOS transistor 16 to turn ON this transistor 16. Since the input signal IN1 is H, the fourth NMOS transistor 12 is turned On to bring a node 32 to L.

Here, the expressions "H" and "L" for the input signals IN1 and IN2 represent states of the analog input signals IN1 and IN2. Namely, the state H means that a voltage level of the input signal or of the node is higher than the threshold of a corresponding transistor, and the state L means that the voltage level is lower than the threshold.

The second bipolar transistor 14 receives the Low (L) input signal IN2 so that the bipolar transistor 14 is turned OFF to turn OFF the first NMOS transistor 15. This puts the node 31 at H. At this time, the third NMOS transistor 11 is OFF.

According to this embodiment, the first bipolar transistor 13 is turned ON at once in response to the input signal so that the node 31 will be H and the second NMOS transistor 16 turned ON. The third and fourth NMOS transistors 11 and 12 operate in response to the input signals, although their operations may be delayed until after the operations of the bipolar transistors 13 and 14, they are earlier than the ON/OFF operations of the first and second NMOS transistors 15 and 16.

Timing of the third and fourth NMOS transistors 11 and 12 to turn OFF is earlier than the first NMOS transistor 15 to turn OFF. This minimize power consumption in switching output levels. Since this embodiment uses bipolar transistors that operate at high speed in response to input signals, the operational speed of this embodiment is faster than that of the conventional circuit. Our tests confirmed that this embodiment could improve the operational speed to 20% faster than that of the conventional circuit, and reduce power consumption by 77% compared with the conventional circuit.

When the input signal IN1 becomes L and the input signal IN2 H, opposite operations will take place to provide the same effect.

In the above embodiment, the present invention has been applied to a semiconductor memory. The present invention is also applicable, as a differential amplifier circuit, to other semiconductor integrated circuit devices.

The above embodiment uses NPN bipolar transistors and N-channel MOSFETs. It is also possible to use transistors of other conduction types.

Figure 5:
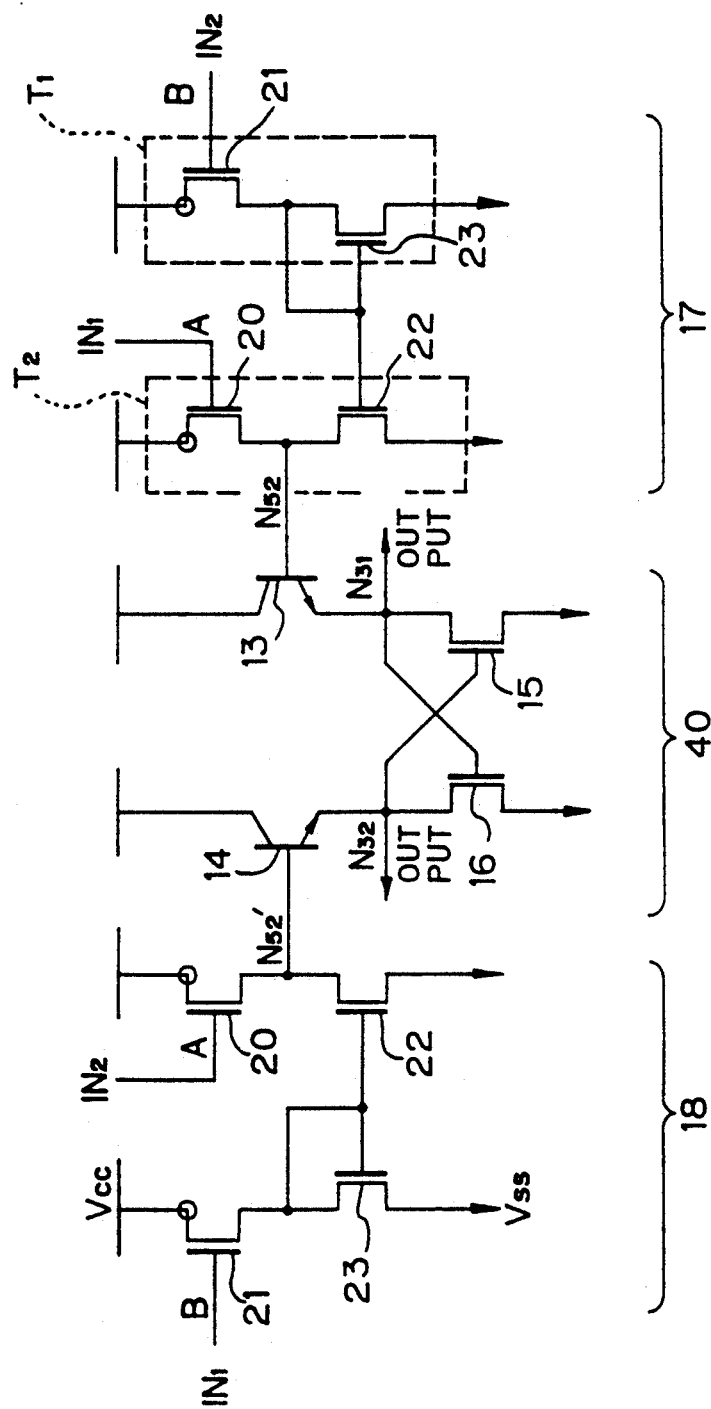
FIG. 5 is a circuit diagram showing a level changing semiconductor integrated circuit according to another embodiment of the present invention.

FIG. 5 shows a semiconductor integrated circuit according to another embodiment of the present invention. Input means 17 and 18 of this embodiment are more powerful in amplifying input signals IN1 and IN2 than those of the previous embodiment.

A level changing semiconductor integrated circuit 40 of FIG. 5 has the differential amplifying function explained with reference to FIG. 2, and involves the first and second input means 17 and 18 that are identically formed.

The input means 17 (18) comprises a first circuit T1 and a second circuit T2 that are connected in parallel with each other. The first circuit T1 involves a fifth MOSFET 21 of first conduction type and a seventh MOSFET 23 of second conduction type that are connected in series. One end of the fifth MOSFET 21 is connected to a high-potential power source Vcc, and one end of the seventh MOSFET 23 is connected to a low-potential power source Vss. The second circuit T2 involves a sixth MOSFET 20 of the first conduction type and an eighth MOSFET 22 of the second conduction type that are connected in series. One end of the sixth MOSFET 20 is connected to the high-potential power source Vcc, and one end of the eighth MOSFET 22 is connected to the low-potential power source Vss.

The gates of the seventh and eighth MOSFETs 23 and 22 are connected to each other. The gate of the seventh MOSFET 23 is connected to a node between the fifth and seventh MOSFETs 21 and 23. A node between the sixth and eighth MOSFETs 20 and 22 forms an output portion N52 (N52') of the input means 17 (18). The gates of the fifth and sixth MOSFETs 21 and 20 are input terminals B and A to which two kinds of input signals having different signal levels are applied.

The output portion N52 of the first input means 17 is connected to the base of a first bipolar transistor 13, and the output portion N52' of the second input means 18 is connected to the base of a second bipolar transistor 14. In the first input means 17, the gate (the input terminal A) of the sixth MOSFET 20 receives a first input signal IN1, and the gate (the input terminal B) of the fifth MOSFET 21 receives a second input signal IN2. In the second input means 18, the gate (the input terminal A) of the sixth MOSFET 20 receives the second input signal IN2, and the gate (the input terminal B) of the fifth MOSFET 21 receives the first input signal IN1.

The input means 17 (18) of this embodiment will be explained next.

In FIG. 5, the MOSFET of the first conduction type is a P-channel MOSFET, and the MOSFET of the second conduction type is an N-channel MOSFET. It is naturally possible that the MOSFET of the first conduction type can be an N-channel MOSFET, and the MOSFET of the second conduction type can be a P-channel MOSFET. The input signals IN1 and IN2 supplied to the input terminals A and B of the input means 17 (18) have two kinds of signal levels as in the previous embodiment.

In the input means 17 (18) of FIG. 5, the gates of the PMOS transistors 20 and 21, i.e., the input terminals A and B, receive the binary digital signals IN1 and IN2. The drains of the PMOS transistors 20 and 21 are connected to the high-potential power source Vcc. The sources of the NMOS transistors 22 and 23 are grounded, i.e., connected to the low-potential power source Vss.

For example, the input signal IN1 is 4 V, and the input signal IN2 is 3.1 V. These input signals alternately take these two levels. In the input means 17, the input terminal A receives the input signal IN1, and the input terminal B receives the input signal IN2. In the input means 18, the input terminal A receives the input signal IN2, and the input terminal B receives the input signal IN1.

When the input signal IN2 becomes High (H), the PMOS transistor 21 is turned OFF, thereby turning OFF the NMOS transistors 23 and 22. Since the input signal IN1 becomes L, the PMOS transistor 20 is turned ON to put the node N52 at H (for example, Vcc=5 V).

When the input signal IN2 becomes L and the input signal IN1 H, the PMOS transistor 21 is turned ON, thereby turning ON the NMOS transistors 23 and 22, and the PMOS transistor 20 is turned OFF to set the node N52 to L (for example, 0 V).

In this way, the levels of the input signals IN1 and IN2 are amplified between 0 V an Vcc, and are output from the node N52.

The digital input signals IN1 and IN2 are oppositely provided to the input means 17 and 18 to produce the above-mentioned operations. In the input means 17, the node N52 provides, in response to the level of the signal IN1, a signal of the same logic to the differential amplifier circuit 40. In the input means 18, the node N52' provides a logic opposite to the level of the input signal IN1.

When the input signal IN2 changes from L to H, the node N52 provides a signal that changes to H, to the base of the first bipolar transistor 13 of the differential amplifier circuit 40. As a result, the first bipolar transistor 13 is turned ON at once to set the node N31 to H. The level H of the node N31 is applied to the gate of a second NMOS transistor 16 to turn ON the same. This puts the other node N32 at L.

More precisely, when the input signal IN2 changes from L to H, the input signal IN1 becomes L and is applied to the gate of the PMOS transistor 20. When the level of the input signal IN1 exceeds a threshold, the PMOS transistor 20 is turned ON to increase the potential of the node N52. When the potential of the node N52 exceeds Vbe of the first bipolar transistor 13, the bipolar transistor 13 is turned ON to increase the potential of the node N31 to H. Namely, the bipolar transistor 13 can pull up the node N31 faster than the PMOS transistor 20 increases the potential of the node N52.

Generally, a bipolar transistor has a collector current that changes exponentially in response to changes in Vbe, and presents a high mutual conductance gm. On the other hand, a MOS transistor has a channel current that changes as a square of a gate voltage, and presents a low mutual conductance gm. In this way, the bipolar transistor has excellent charging and discharging characteristics of a load capacity, compared with the MOS transistor.

As soon as the potential of the node N52 exceeds Vbe, the node N31 is immediately pulled up to H. In other words, a steep shift is realized when the node N52 changes to H to ensure speedier operation than the conventional circuit.

Similarly in the input means 18, the node N52' provides a signal that changes to H, to the base of the second bipolar transistor 14 of the differential amplifier circuit 40. As a result, as explained above, the node N32 is pulled up faster than in the conventional circuit.

When the input signal IN1 changes from H to L, the node N52 provides a signal that changes to L, to the base of the first bipolar transistor 13 of the differential amplifier circuit 40. Due to this, the first bipolar transistor 13 turns OFF at once. At this time, in the input means 18, a signal that changes to H is applied to the node N52', so that the second bipolar transistor 14 turns ON at once. As a result, the potential of the gate of the first NMOS transistor 15 increases to turn ON the same. The node N31, therefore, drops to L at once. In this case also, the second bipolar transistor 14 immediately turns ON when the node N52' changes to H, to turn ON the first NMOS transistor 15, thereby immediately dropping the level of the node N31 for the same reasons mentioned above. Namely, to drop the levels of the nodes N31 and N32, the cross-coupled first and second NMOS transistors 15 and 16 are turned ON to realize a high-speed operation.

Since each of the input means 17 and 18 of this embodiment includes the MOS transistors 20, 21, 22, and 23, a power source and a temperature margin may be of large sizes. The differential amplifier circuit 40 includes the bipolar transistors 13 and 14 to properly use the high-speed characteristics of the bipolar transistors, thereby realizing a very high-speed operation.

In the above embodiment, the present invention has been applied to a semiconductor memory. The present invention is also applicable, as a differential amplifier circuit, to other semiconductor integrated circuit devices.

Figure 6:
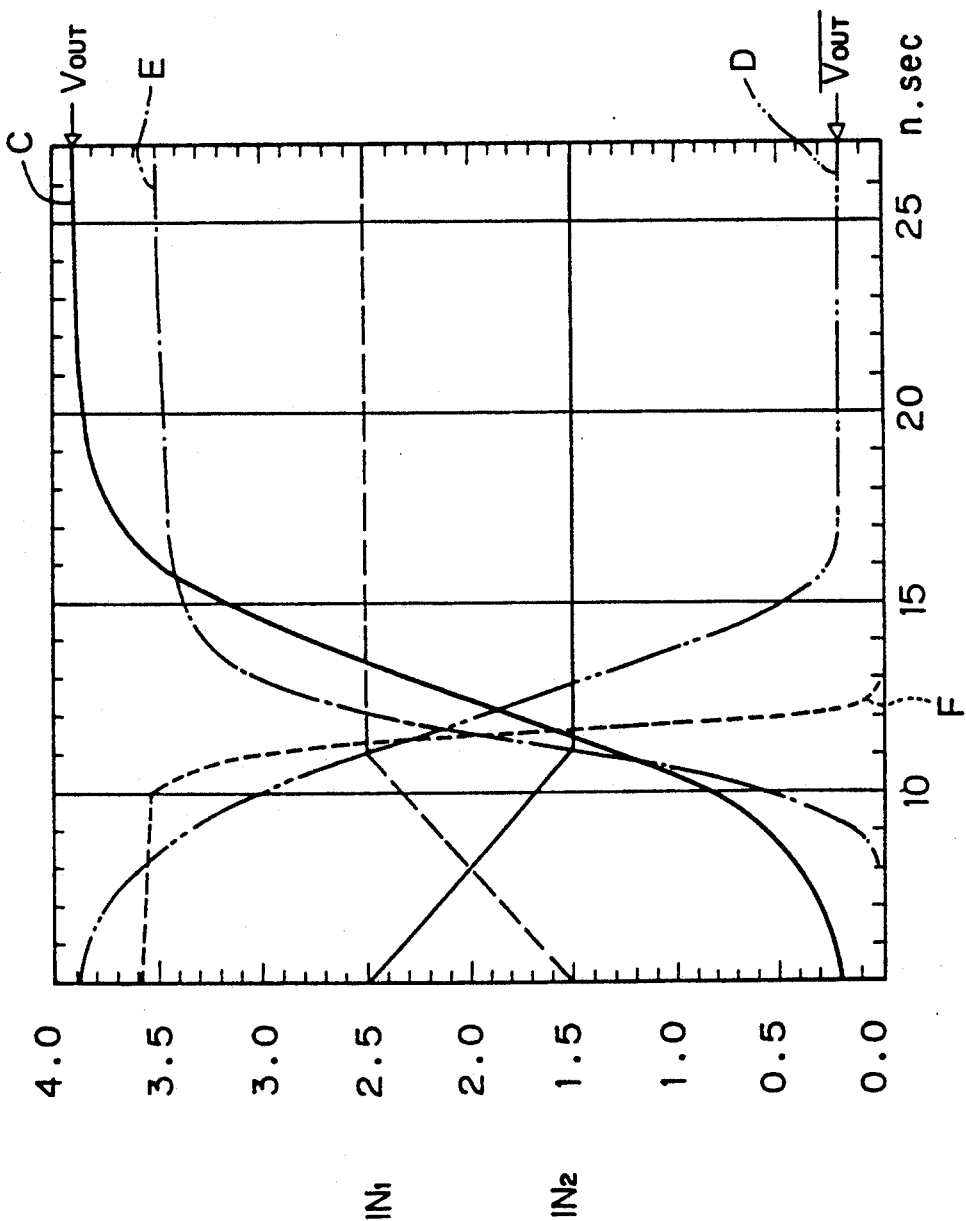
FIG. 6 is a graph showing effects of the level changing semiconductor integrated circuit of the present invention.

FIG. 6 is a graph showing the effect of the present invention in improving the switching speed of a semiconductor integrated circuit, compared with that of the conventional circuit. When an input signal IN1 (a high level signal) of 2.5 V and an input signal IN2 (a low level signal) of 1.5 V are applied to input terminals and switched at an interval of 1.6 nsec, the conventional circuit provides outputs Vout and inverted Vout indicated by curves C and D, respectively. As is apparent in the graph, the curves C and D are obtuse. The amount of time necessary for increasing or decreasing an output voltage from 1.0 V to 3.0 V is 4.5 nsec on the curves C and D of the conventional circuit.

On the other hand, the circuit device of the present invention indicated with curves E and F shows a switching speed of 2.5 nsec for the same interval from 1.0 V to 3.0 V, although it shows some decrease in output voltage difference. In this way, the present invention can improve operational speed.

Figure 7:
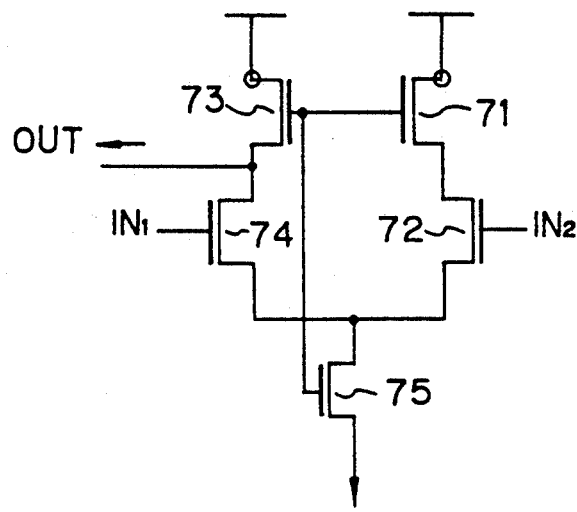
FIG. 7 is a circuit diagram showing another embodiment of an input means used in the present invention.

In the present invention, a circuit as shown in FIG. 7 can be used as both the first and second input means.

In that, P channel type MOSFET 71 and N channel type MOSFET 72 are connected in series to form a first current path and one terminal of the P channel type MOSFET 71 is connected to a high-potential power source while P channel type MOSFET 73 and N channel type MOSFET 74 are connected in series to form a first current path and one terminal of the P channel type MOSFET 71 is connected to a high-potential power source.

Another MOSFET 75 is provided, one terminal of the MOSFET 75 being connected to a low-potential power source and other terminal thereof is connected to both other terminals of the MOSFETs 72 and 74 while both gates of the MOSFETs 71 and 73 are connected to the gate of the MOSFET 75.

As apparent from FIG. 7, two signals having different signal level from each other are input to the gate of the MOSFETs 72 and 74 respectively.

An output signal is output from a node formed between the MOSFETs 73 and 74 to input of the semiconductor integrated circuit 40.

Figure 8:
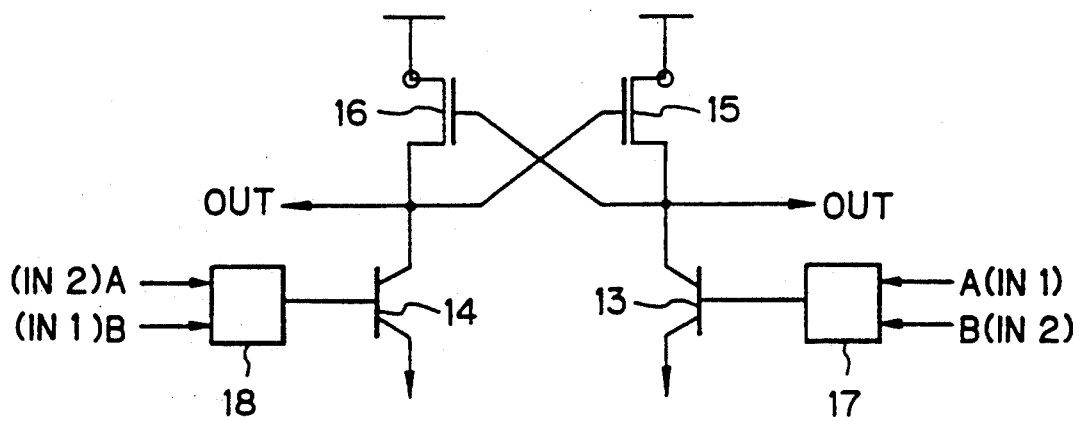
FIG. 8 is a circuit diagram showing another embodiment of a main part of the level changing semiconductor integrated circuit used in the present invention.

In the embodiments described above, although the semiconductor circuit as shown in FIG. 2 is used as the level changing semiconductor integrated circuit 40 providing the differential amplifying function, another semiconductor circuit as shown in FIG. 8 can apparently be used as the same circuit.

As shown in FIG. 8, the construction of the circuit is such that connecting portions of the bipolar transistor and the MOSFET to the high-potential power source and the low-potential power source respectively are reversed to that of the circuit as shown in FIG. 2.

Note, that in FIG. 8, the level changing semiconductor integrated circuit 40 comprises a first current path 11 involving a first bipolar transistor 13 and a first MOSFET 15 that are connected in series, the collector of the first bipolar transistor 13 being connected to one terminal of the first MOSFET 15, the other terminal of the first MOSFET 15 being connected to the high-potential power source, the emitter of the bipolar transistor 13 being connected to the low-potential power source and a second current path 12 involving a first bipolar transistor 14 and a first MOSFET 16 that are connected in series, the collector of the first bipolar transistor 14 being connected to one terminal of the first MOSFET 16, the other terminal of the first MOSFET 16 being connected to the high-potential power source, the emitter of the bipolar transistor 14 being connected to the low-potential power source and further the gates of both MOSFETs 15 and 16 are cross-connected to the corrector of the bipolar transistor 14 and 13 arranged in the opposite current path, respectively.

In this embodiment, P channel type MOSFETs are used but opposite type of MOSFETs may be used if a case requires.

The effects obtained by the present invention will be explained hereunder.

Figure 1:
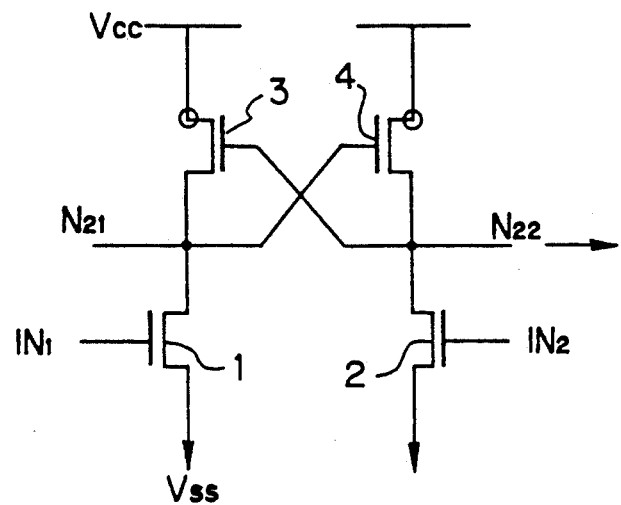
FIG. 1 is a circuit diagram showing a conventional differential amplifier circuit for amplifying an output of a sense amplifier, etc.

First, the effect of the circuit construction of the present invention shown in FIG. 2 is compared with that of the Prior Art shown in FIG. 1.

In this comparison test, an emitter length of a bi-polar transistor was solidly fixed at 20 μm and a gate width W of the N channel MOSFET was fixed at 0.8 μm while a gate width of the P channel MOSFET was fixed at 1.1 μm.

Under these conditions, a gate length L of both N channel and P channel MOSFETs were varied from 10 to 50 μm.

Further, loads connected to both outputs of the level changing semiconductor integrated circuit 40 were changed from 0.5 pf to 20 pf, respectively.

In accordance with this comparison test, a switching speed of the level changing semiconductor integrated circuit 40 was measured.

The switching speed in this test was determined by measuring a time when an output signal level thereof is changed from lower-most level, for example, 0 V up to 3 V or from higher-most level, for example, 4.2 V down to 1 V.

Figure 9:
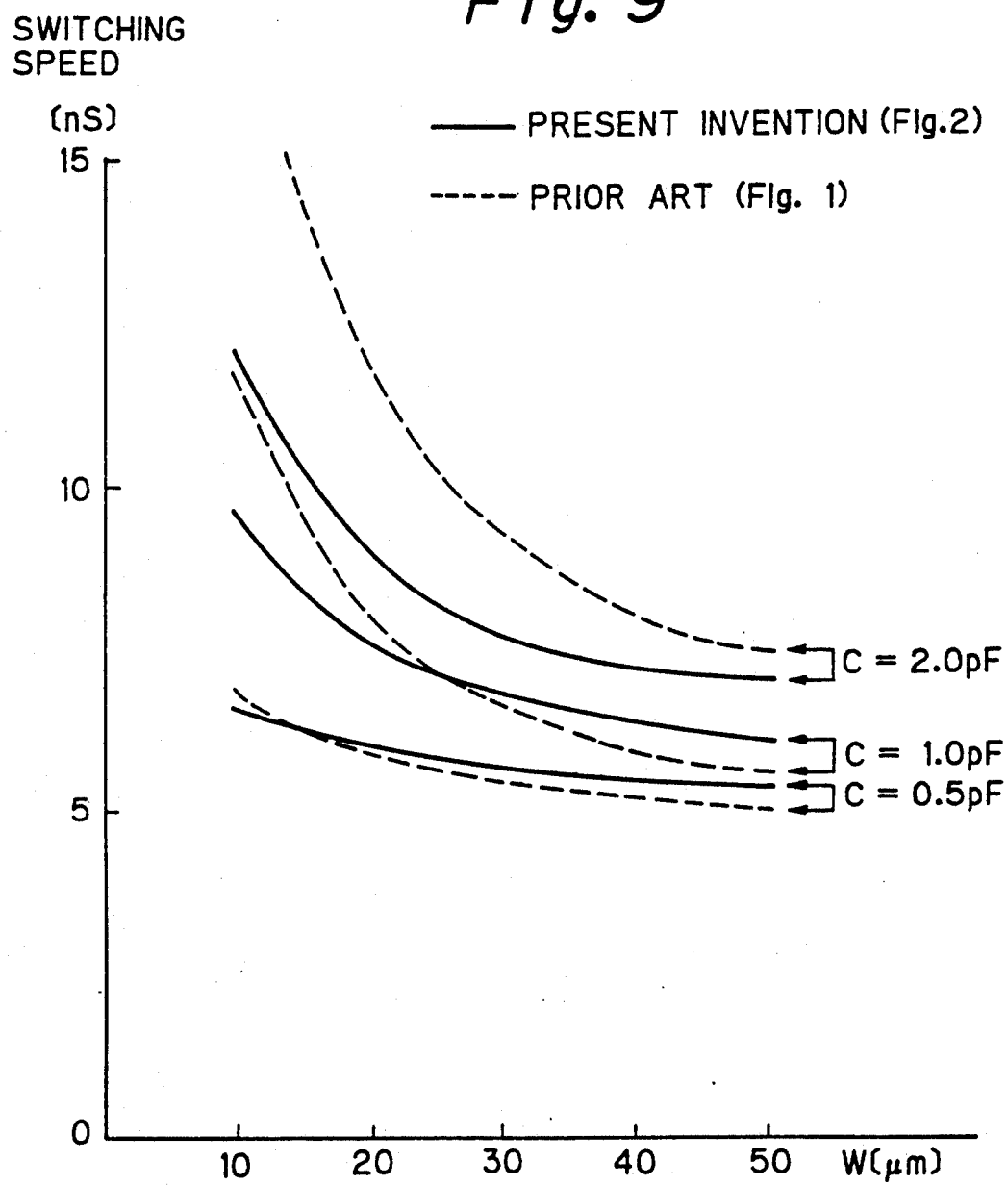
FIG. 9 is a graph showing a switching speed obtained by the present invention and prior art.

The results thereof are shown in FIG. 9 and as apparent from FIG. 9, although, when the load is small, the switching speed of the present invention is not so different from that of the conventional one, as the load increases, i.e., exceeds over 1.0 pf, the switching speed of the present invention is superior to that of the conventional one.

Secondly, the effect of another circuits as shown in FIGS. 4 and 8 are compared with the conventional one as shown in FIG. 1.

These comparison tests above were carried out under the same conditions as explained above.

Both a switching speed of these circuits as defined above and a current value defined as an average current value flown in these circuits when they are operated with 40 ns cycle, respectively, are measured as characteristic value.

The results thereof are shown in Table 1 below and it shows that although no critical difference can be seen in the switching speed between the circuit of the present invention as shown in FIG. 4 and the conventional one as shown in FIG. 1, the present invention can save a remarkable amount of the current value compared with that of the conventional one and this fact contributes to reduce current consumptions.

While, it shows that although no critical difference can be seen in the current amount between the circuit of the present invention as shown in FIG. 8 and the conventional one as shown in FIG. 1, the present invention is superior to the conventional one in the switching speed point of view.

TABLE 1

(Output load = 0.5 PF)

| Circuit | Switching speed (nS) | | | Current value (mA) | | |
|---|---|---|---|---|---|---|
| Gate Length [mm] | FIG. 4 | FIG. 8 | FIG. 1 (Prior Art) | FIG. 4 | FIG. 8 | FIG. 1 (Prior Art) |
| 10 | 7.0 | 8.3 | 6.9 | 0.726 | 1.99 | 1.20 |
| 20 | 6.4 | 5.6 | 5.9 | 0.922 | 2.20 | 1.57 |
| 30 | 6.0 | 4.7 | 5.5 | 1.22 | 2.42 | 1.98 |
| 40 | 5.8 | 4.5 | 5.2 | 1.47 | 2.90 | 2.41 |
| 50 | 5.7 | 4.5 | 5.1 | 1.74 | 3.28 | 2.77 |

As explained above, the semiconductor integrated circuit device of the present invention can be used in variously wide applications in which a change in a voltage level of an output signal output from a certain circuit should be transmitted to a successive circuit located down stream of the circuit as quick as possible.

Figure 10:
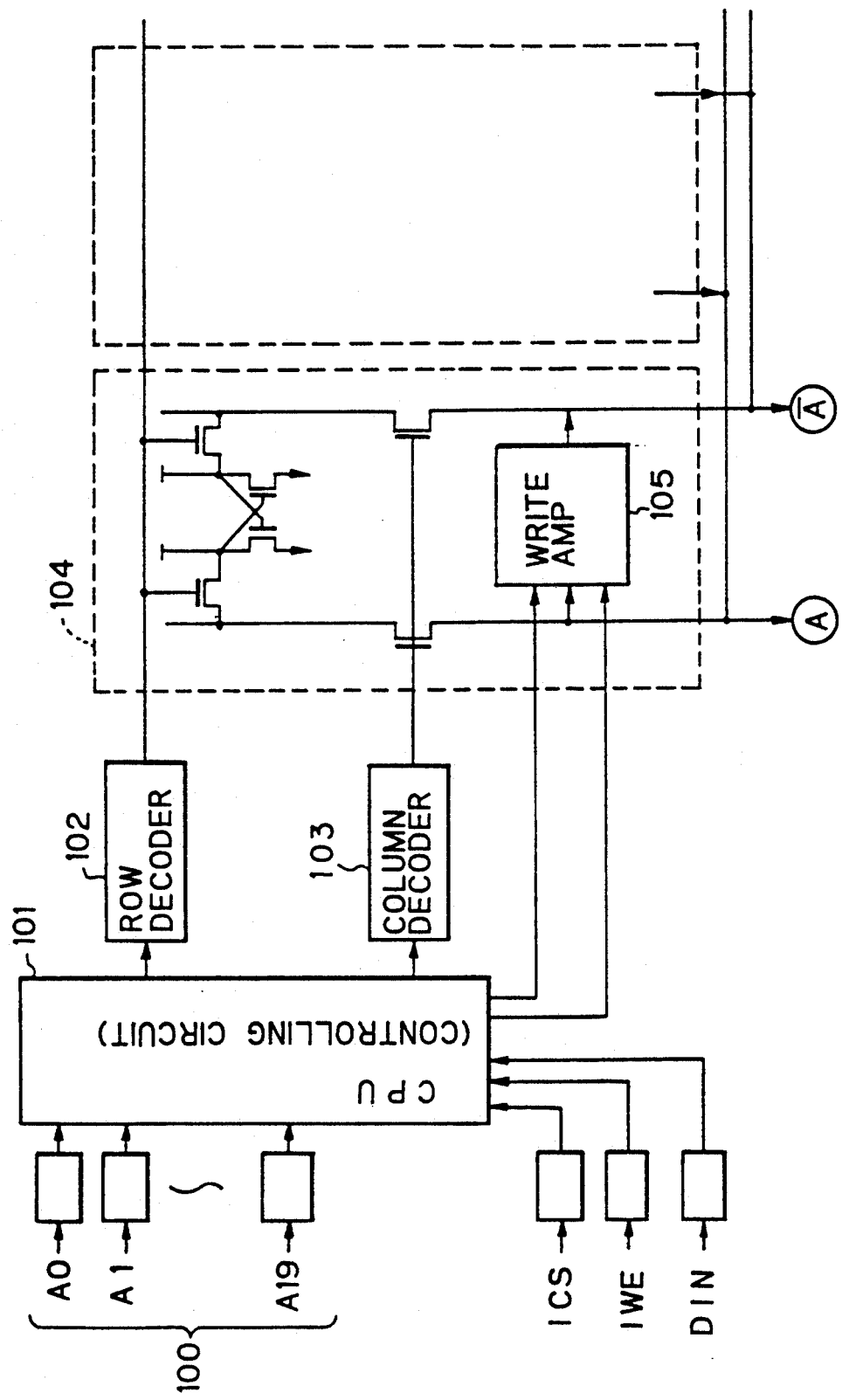
FIG. 10 is a block diagram showing a conventional memory circuit.
Figure 11:
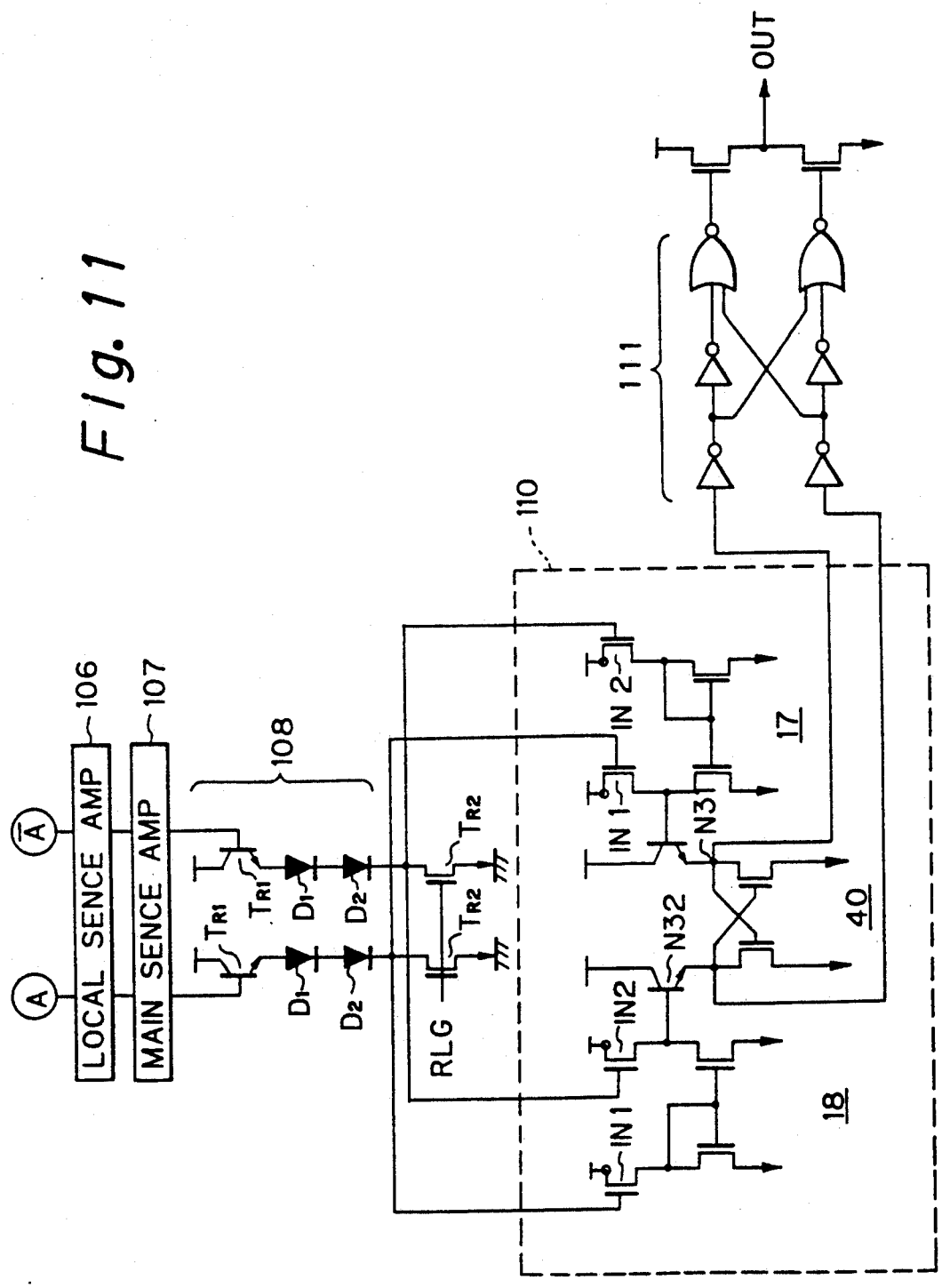
FIG. 11 is a block diagram showing a place in which the device of the present invention is used.

FIGS. 10 and 11 show one example of the applications of the present invention in which the semiconductor integrated circuit device of the present invention is used as a level change circuit amplifying outputs output from a sense amplifier with high speed.

Note that, FIG. 10 shows a block diagram of a part of a conventional memory circuit and only two memory cells 104 of the memory circuit are indicated.

In this circuit, a pair of output signals A and $\overline{A}$, both of which being complementary signal each other and output from one of the memory circuits are controlled, for example, by address signals A0, A1, - - - A19 through a controlling circuit 101, row and column decoders 102 and 103 and a write amplifier 105.

On the other hand, FIG. 11 shows one example of a circuit diagram illustrating how the inputs of the semiconductor integrated circuit device of the present invention are connected to the outputs of the memory circuit and how the outputs of the integrated circuit device of the present invention are connected to a successive circuit.

In this embodiment, the output signals A and $\overline{A}$ of the memory circuit are first input to a local sense amplifier 106 simultaneously and successively the outputs thereof are input to a main sense amplifier 107.

Then the output signals output from the main sense amplifier 107 are input to input terminals IN1 and IN2 of the integrated circuit device 110 of the present invention, respectively, through a level shifting circuit 108 comprising a bipolar transistor TR1, two diodes D1 and D2 which are connected in series each other.

In this level shifting circuit 108, another MOSFET transistor TR2 is provided serving as a constant current source.

As shown in FIG. 11, one of the output signals A output from the main sense amplifier is input to both of an input terminal IN1 of a first input means 17 and an input terminal IN1 of a second input means 18 respectively.

While, another output signals $\overline{A}$ output from the main sense amplifier is input to both of an input terminal IN2 of a first input means 17 and an input terminal IN2 of a second input means 18, respectively.

On the other hand, outputs of the integrated circuit device 110 of the present invention, generated at node portions N31 and N32 respectively, are output from an output terminal OUT through an output buffer 111 comprising a flip-flop circuit.

As described above, the present invention can have a large power source and a large temperature margin. The present invention properly uses bipolar transistors and their high-speed operation characteristics, thereby realizing a high-speed differential amplifier circuit.

I claim:

1. A level changing semiconductor integrated circuit comprising:

a first current path including a first bipolar transistor and a first MOSFET that are connected in series, an emitter of said first bipolar transistor being connected to one terminal of said first MOSFET, a collector of said first bipolar transistor being connected to a high-potential power source, another terminal of said first MOSFET being connected to a low-potential power source; and a second current path including a second bipolar transistor and a second MOSFET that are connected in series, an emitter of said second bipolar transistor being connected to one terminal of said second MOSFET, a collector of said second bipolar transistor being connected to the high-potential power source, another terminal of said second MOSFET being connected to the low-potential power source, a gate of said first MOSFET being cross-connected to the emitter of said second bipolar transistor of said second current path, a gate of said second MOSFET being cross-connected to the emitter of said first bipolar transistor of said first current path, the emitters of said first and second bipolar transistors providing output signals, at least two different types of input signals having different signal levels from each other being simultaneously applied to respective first and second input means of said first current path while said at least two different types of input signals are simultaneously and oppositely applied to respective second and first input means of said second current path, therein controlling currents flowing through said first and second current paths.

2. A level changing semiconductor integrated circuit comprising:

a first current path including a first bipolar transistor and a first MOSFET that are connected in series, an emitter of said first bipolar transistor being connected to one terminal of said first MOSFET, a collector of said first bipolar transistor being connected to a high-potential power source, another terminal of said first MOSFET being connected to a low-potential power source;

a second current path including a second bipolar transistor and a second MOSFET that are connected in series, an emitter of said second bipolar transistor being connected to one terminal of said second MOSFET, a collector of said second bipolar transistor being connected to the high-potential power source, another terminal of said second MOSFET being connected to the low-potential power source, a gate of said first MOSFET being cross-connected to the emitter of said second bipolar transistor of said second current path, a gate of said second MOSFET being cross-connected to the emitter of said first bipolar transistor of said first current path, the emitters of said first and second bipolar transistors providing output signals, a third MOSFET disposed between said first MOSFET and the low-potential power source; and a fourth MOSFET disposed between said second MOSFET and the low-potential power source, a base of said first bipolar transistor receiving a first input signal, a gate of said third MOSFET receiving a second input signal, a base of said second bipolar transistor receiving the second input signal, and a gate of said fourth MOSFET receiving the first input signal.

3. A level changing semiconductor integrated circuit comprising:

a first current path including a first bipolar transistor and a first MOSFET that are connected in series, an emitter of said first bipolar transistor being connected to one terminal of said first MOSFET, a collector of said first bipolar transistor being connected to a high-potential power source, another terminal of said first MOSFET being connected to a low-potential power source;

a second current path including a second bipolar transistor and a second MOSFET that are connected in series, an emitter of said second bipolar transistor being connected to one terminal of said second MOSFET, a collector of said second bipolar transistor being connected to the high-potential power source, another terminal of said second MOSFET being connected to the low-potential power source, a gate of said first MOSFET being cross-connected to the emitter of said second bipolar transistor of said second current path, a gate of said second MOSFET being cross-connected to the emitter of said first bipolar transistor of said first current path, the emitters of said first and second bipolar transistors providing output signals, wherein said first and second current paths have first and second input means, each input means comprises:

a first circuit including a fifth MOSFET of a first conduction type and a seventh MOSFET of a second conduction type that are connected in series, one terminal of said fifth MOSFET being connected to the high-potential power source, one terminal of said seventh MOSFET being connected to the low-potential power source; and a second circuit including a sixth MOSFET of the first conduction type and an eighth MOSFET of the second conduction type that are connected in series, one terminal of said sixth MOSFET being connected to the high-potential power source, one terminal of said eighth MOSFET being connected to the low-potential power source, said first and second circuits being connected in parallel with each other, gates of said seventh and eighth MOSFETs being connected to each other, the gate of said seventh MOSFET being connected to a node between said fifth and seventh MOSFETS, a node between said sixth and eighth MOSFETs being an output portion of each input means, gates of said fifth and sixth MOSFETs being input terminals for receiving two different types of input signals having different signal levels, respectively, the output portion of said first input means being connected to a base of said first bipolar transistor, the output portion of said second input means being connected to a base of said second bipolar transistor, in said first input means, the gate of said fifth MOSFET receiving a first input signal, and the gate of said sixth MOSFET receiving a second input signal, and in said second input means, the gate of said fifth MOSFET receiving a second input signal, and the gate of said sixth MOSFET receiving a first input signal.

4. A level changing semiconductor integrated circuit comprising:

a first current path means including a first bipolar transistor, a collector thereof being connected to a first potential power source and an emitter thereof being connected to a first output terminal, and a first MOSFET and a second MOSFET serially connected to each other and provided between said first output terminal and a second potential power source; and a second current path means including a second bipolar transistor, a collector thereof being connected to said first potential power source and an emitter thereof being connected to a second output terminal, and a third MOSFET and a fourth MOSFET serially connected to each other and provided between said second output terminal and said second potential power source, a gate of said first MOSFET being connected to said second output terminal and a gate of said second MOSFET being connected to said first output terminal, and a first signal being simultaneously applied to a base of said first bipolar transistor and to a gate of said fourth MOSFET and a second signal having a different signal level from said first signal being simultaneously applied to a base of said second bipolar transistor, and to the gate of said second MOSFET wherein when said first bipolar transistor is turned ON, said second MOSFET is turned OFF earlier than when said first MOSFET is turned OFF, and when said second bipolar transistor is turned ON, said fourth MOSFET is turned OFF earlier than when said third MOSFET is turned OFF.

* * * * *